(12) United States Patent
Vu

(10) Patent No.: US 7,271,788 B2
(45) Date of Patent: Sep. 18, 2007

(54) GENERATING ADJUSTABLE-DELAY CLOCK SIGNAL FOR PROCESSING COLOR SIGNALS

(75) Inventor: Ha Chu Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 490 days.

(21) Appl. No.: 10/718,975

(22) Filed: Nov. 20, 2003

(65) Prior Publication Data

US 2005/0110552 A1   May 26, 2005

(51) Int. Cl.
*G09G 3/36*   (2006.01)
*H03L 7/00*   (2006.01)
(52) U.S. Cl. .......................................... 345/87; 331/25
(58) Field of Classification Search ................ 345/213, 345/98–100, 87; 331/25, 12
See application file for complete search history.

(56) References Cited

U.S. PATENT DOCUMENTS

| | | | | |
|---|---|---|---|---|
| 5,062,005 | A * | 10/1991 | Kitaura et al. ................. | 386/90 |
| 6,144,355 | A * | 11/2000 | Murata et al. ................. | 345/99 |
| 6,621,480 | B1 * | 9/2003 | Morita ......................... | 345/99 |
| 7,145,579 | B2 * | 12/2006 | Arai et al. .................... | 345/690 |
| 7,151,537 | B1 * | 12/2006 | Von Hase ..................... | 345/213 |
| 2002/0122503 | A1 * | 9/2002 | Agazzi ......................... | 375/316 |
| 2004/0032406 | A1 * | 2/2004 | Agarwal et al. ............. | 345/213 |
| 2004/0135602 | A1 * | 7/2004 | Ward et al. .................. | 327/141 |
| 2004/0223571 | A1 * | 11/2004 | Donnelly et al. ............ | 375/371 |

OTHER PUBLICATIONS

Marie, Herve, et al. "R, G, B Acquisition Interface with Line-Locked Clock Generator for Flat Panel Display", IEEE Journal of Solid-State Circuits, vol. 33, No. 7, Jul. 1998, pp. 1009-1013.
Marie, Herve, et al. "Correction to R, G, B Acquisition Interface with Line-Locked Clock Generator for Flat Panel Display", IEEE Journal of Solid-State Circuits, vol. 35, No. 8, Aug. 2000, p. 1253.

* cited by examiner

*Primary Examiner*—Amr A. Awad
*Assistant Examiner*—Stephen G Sherman
(74) *Attorney, Agent, or Firm*—Darby & Darby PC; Davin Chin

(57) ABSTRACT

Circuits, devices and methods provide a phase delay and use it to select when an analog color signal is converted to digital. The phase delay is adjustable, which permits choosing a moment in time when conversion results in improved processing. A PLL circuit receives the synchronizing signal of the color signals, and generates phased signals. A phase adjuster generates an adjustable delay signal by mixing in suitable proportions two of the phased signals that are 45 degrees apart. The delay signal is used by an analog to digital converter, to adjust when exactly it is to be sampled.

29 Claims, 16 Drawing Sheets

WEIGHT VALUES FOR SIMULATED PHASES

PHASE ADJUSTER IC

Fig.10 PHASE DECODER

PHASE SELECTOR CHIP

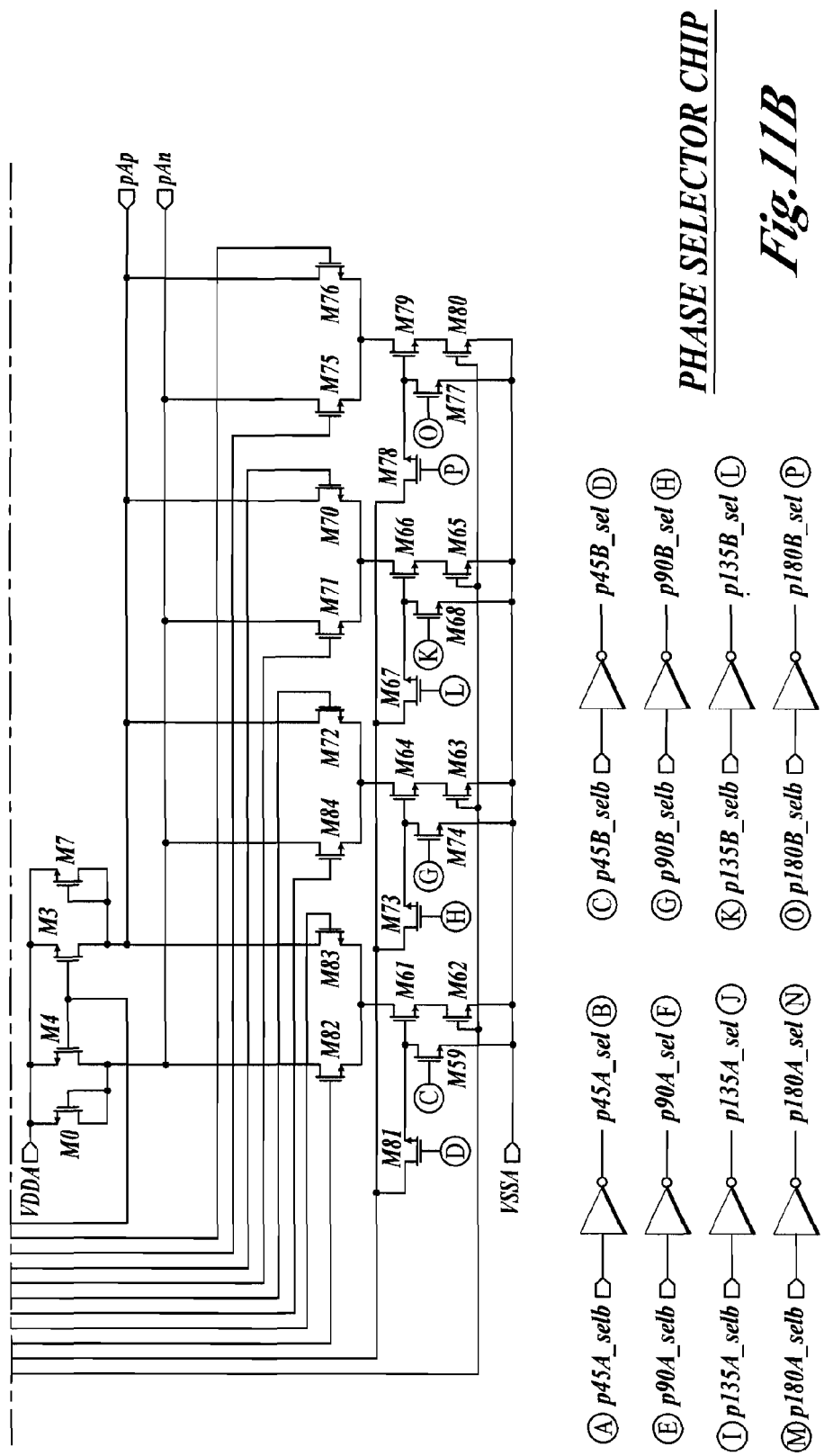
Fig. 11B *PHASE SELECTOR CHIP*

PDAC

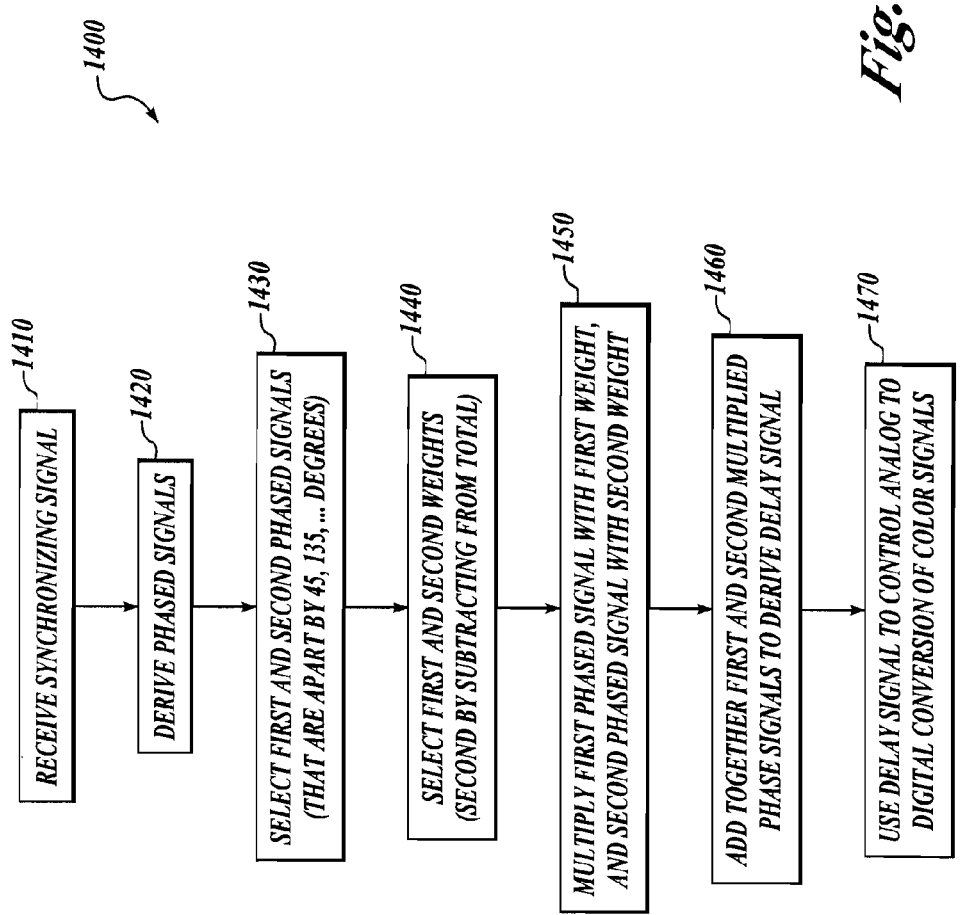

GENERATING ADJUSTABLE-DELAY CLOCK SIGNAL FOR PROCESSING COLOR SIGNALS

FIELD OF THE INVENTION

The present invention is related to the field of generating signals for displays, and more specifically to circuits, devices, and methods for generating a clock signal having a delay suitable for processing a color signal.

BACKGROUND

Color displays frequently display color data that is in digital form. The color data is usually available in color signals that are in analog form. An interface for processing color signals typically employs an Analog to Digital Converter (ADC), for converting the available analog color signals into digital data suitable for displaying. Conversion is improved if it occurs at a moment in time that is long enough after the received color signal has settled to its final value, but not too long so as to delay operation of the whole system.

BRIEF DESCRIPTION OF THE DRAWINGS

The invention will become more readily apparent from the following Detailed Description, which proceeds with reference to the accompanying drawings, in which:

FIG. 14 illustrates a flowchart for describing a method according to an embodiment of the present invention.

DETAILED DESCRIPTION

Figure 1:
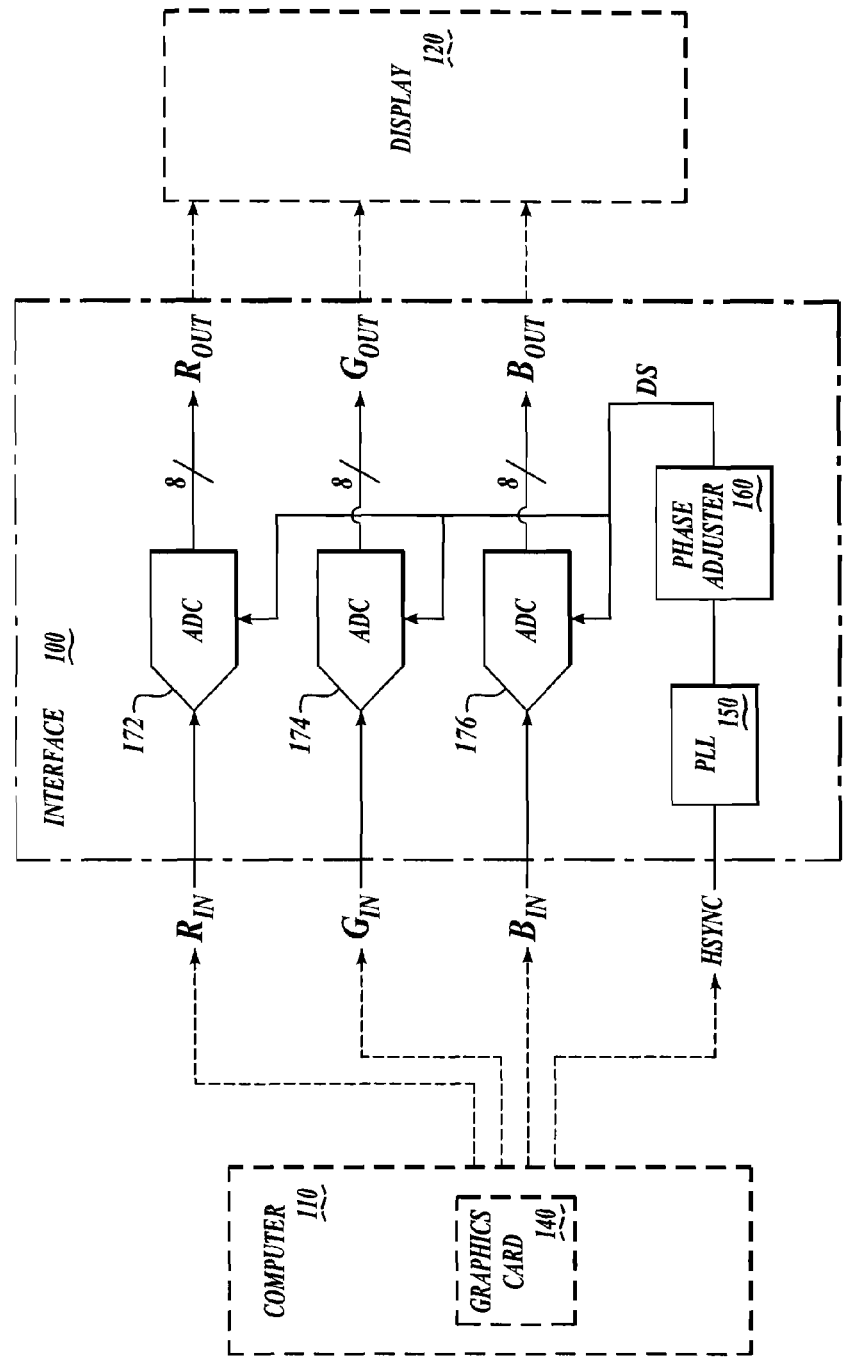
FIG. 1 is a block diagram of an interface for processing color signals for a display.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the specification, the meaning of "a," "an," and "the" may also include plural references. The meaning of "in" includes "in" and "on." The term "coupled" means a direct connection between the items that are connected, or an indirect connection through one or more intermediary devices or components.

Briefly, the present invention provides circuits, devices, and methods for providing a phase delay and using it to select when an analog color signal is processed. The phase delay is adjustable, which permits choosing a moment in time when the operation results in improved processing. A PLL circuit receives a synchronizing signal of the color signal, and generates phased signals. A phase adjuster generates an adjustable delay signal by mixing in suitable proportions two of the phased signals that are 45 degrees apart. The delay signal is used by an analog to digital converter, to adjust when exactly it is to be sampled.

The invention offers the advantage that it offers a delay signal with a fine resolution of available phase delays. Further, the circuit of the invention operates at higher frequency and lower supply voltage.

The invention is now described in more detail.

FIG. 1 is a block diagram of an interface circuit 100, which is used to receive signals from a computer 110 and convert them for use by a display 120. A graphics card 140 in computer 100 encodes an image in signals Rin, Gin, Bin and HSYNC. Analog color signals Rin, Gin, Bin encode respectively the red, green, and blue color content of the pixels. Signal HSYNC encodes a horizontal synchronizing signal that is associated with color signals Rin, Gin, Bin, and more particularly identifies the beginning of a new line on the display.

Color signals Rin, Gin, Bin are received in interface circuit 100, and are processed. Processing includes converting to digital color signals Rout, Gout, Bout. Signals Rout, Gout, Bout can be made from 8 bits each, or a different number of bits. Signals Rout, Gout, Bout are received in display 120, where they cause the encoded image to be displayed. They may be 256-level Pulse Amplitude Modulated (PAM) at the pixel frequency rate.

Interface circuit 100 may be embodied in any number of ways. For example, it may be implemented by itself as a standalone unit, or as part of either computer 110 or display 120. It may be embodied as an integrated circuit, or as a card or other way to implement a circuit.

Interface circuit 100 includes a phase locked loop PLL circuit 150, which may be used to generate a signal replicating the pixel clock used in display 120. PLL circuit 150 may advantageously have four stages, which can generate at least four phased signals from signal HSYNC. The phased signals are input into a phase adjuster 160, which generates a delay signal DS. In one embodiment, delay signal DS acts as a replicated pixel clock of the clock that is used within display 120.

Three high-speed Analog to Digital Converters (ADCs) 172, 174, 176 receive respectively color signals Rin, Gin, Bin. ADCs 172, 174, 176 process the received color signals Rin, Gin, Bin as controlled by the delay signal DS.

Figure 2:
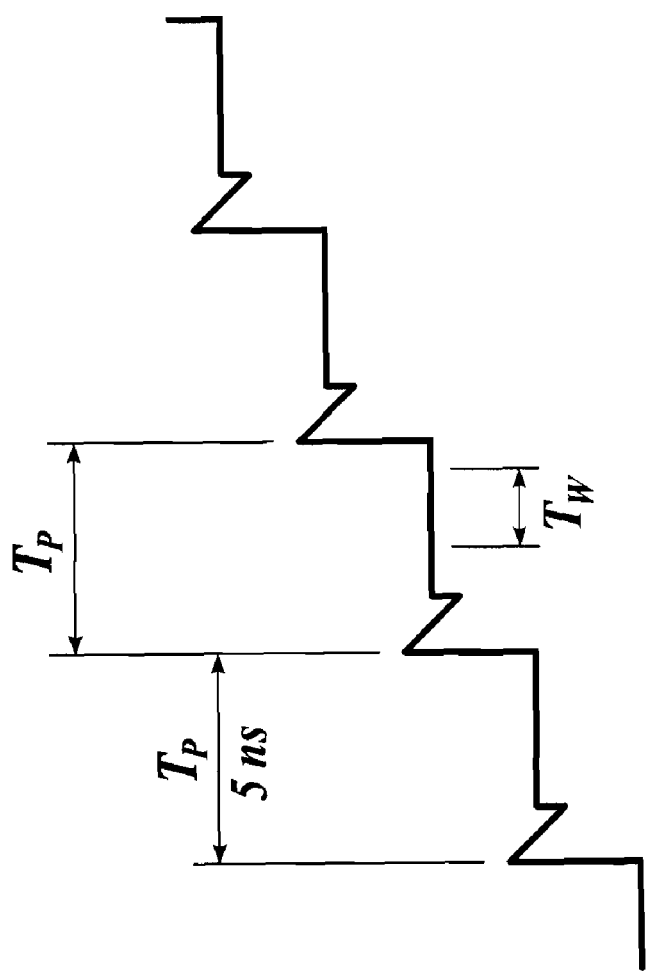
FIG. 2 is a time diagram showing a waveform of a received color signal, and windows within which an analog color signal may advantageously be sampled for being converted into a digital signal.

FIG. 2 shows a waveform of a received one of color signals Rin, Gin, Bin. Each pixel is received over a time interval Tp. Within each time interval Tp, there is a window Tw for preferred sampling, to improve accuracy. Both the pixel time intervals Tp and the windows Tw are short. For example, the UXGA standard for high speed flat panel displays requires a pixel clock rate of 202 MHz. Thus the pixels have a time interval Tp of only 5 ns. A portion of that is the time window Tw in which to be sampled accurately.

Figure 3:
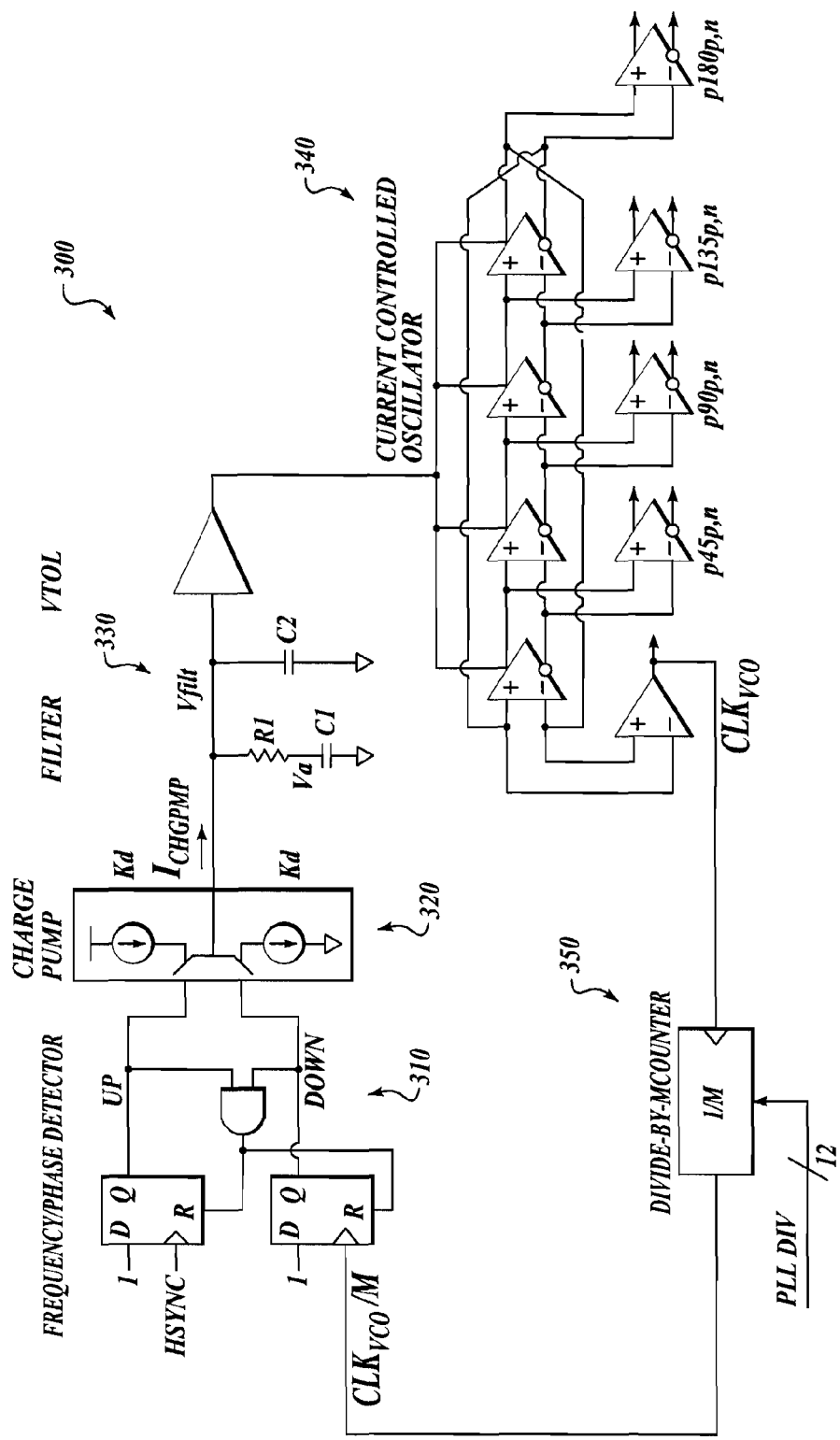
FIG. 3 illustrates a sample schematic diagram of a circuit for implementing a Phase Locked Loop (PLL) circuit of the interface of FIG. 1.

FIG. 3 illustrates a sample schematic diagram of a circuit 300 for implementing phase locked loop (PLL) circuit 150. A frequency/phase detector 310 receives signal HSYNC, and a divided down signal $clk_{VCO}/M$. Detector 310 compares these two signals, and generates an output that is directed to a charge pump 320, whose output is in turn directed to a filter 330. An output of filter 330 is directed to a fast clock generator 340, which is made from a voltage to current converter and a current controlled oscillator. Fast clock generator 340 outputs four phased signals p45, p90, p135 and p180. Each of these signals may optionally be provided with its positive (p) sign, and also be provided with its negative sign (n). One more output carries fast clock signal $clk_{VCO}$, which may be just one more of the clock phases. A divide-by-M counter 350 receives fast clock signal $clk_{VCO}$, and generates divided down signal $clk_{VCO}/M$.

Figure 4:
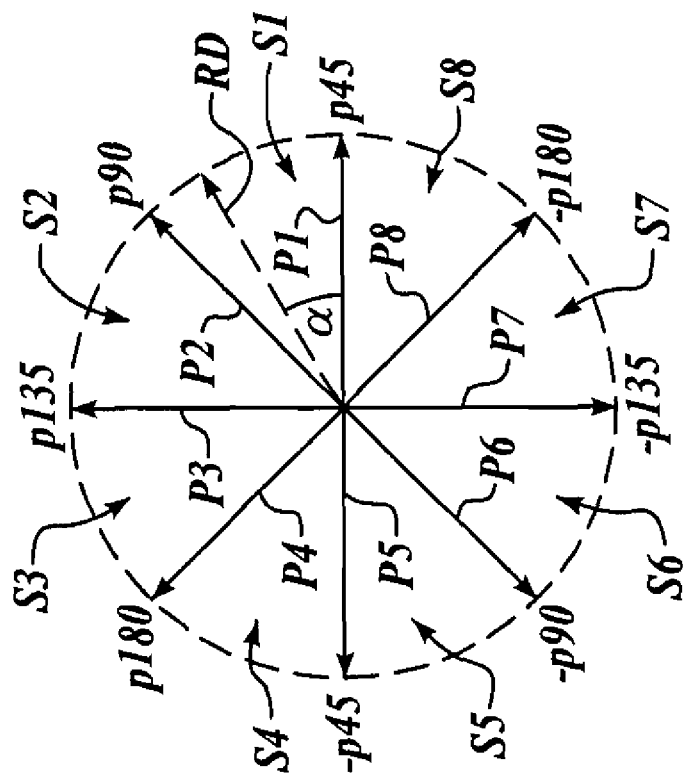
FIG. 4 illustrates a phase diagram, and further how the phases of four phased signals and their negatives define eight sectors.

FIG. 4 is a phase diagram given as a circle that represents time interval Tp. Four phased signals have phases P1, P2, P3 and P4, at angles that are 45, 90, 135, and 180 degrees respectively. Their negatives have phases P5, P6, P7 and P8, at angles that are −45, −90, −135, and −180 degrees respectively. All phases P1, . . . , P8 define eight sectors S1, . . . , S8 between them in the circle.

To implement a general required delay, its location may be found first in a phase diagram, such as that of FIG. 4. Then two phased signals may be chosen, such that they define between them a sector on the phase diagram, which encompasses the general required delay. As an example only, a general requested delay RD is found within sector S1, bordered by phases P1 and P2. Within that sector, general requested delay RD has a phase angle α measuring counterclockwise from phase P1.

Figure 5:
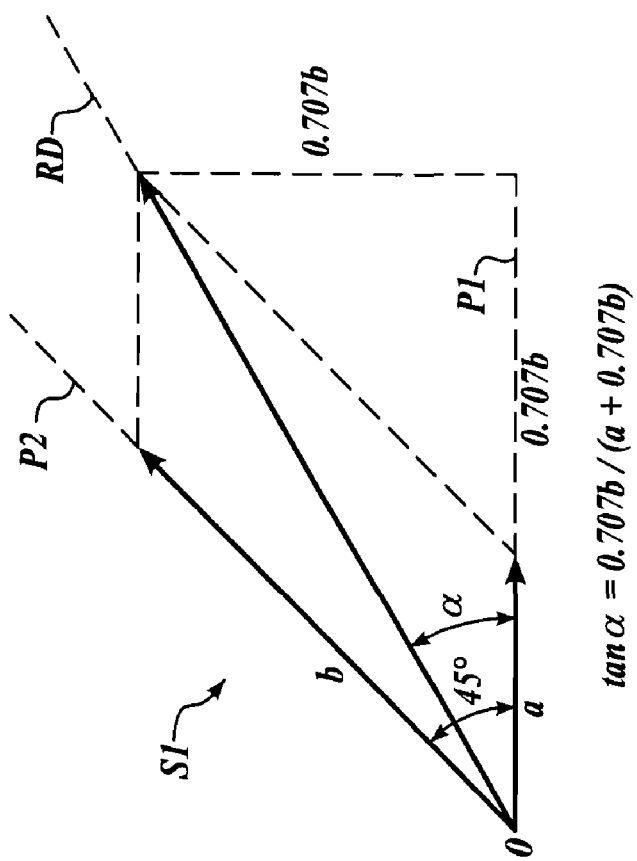
FIG. 5 illustrates is a diagram of a sector of the phase diagram of FIG. 4, further illustrating the relative location of a general requested delay.

FIG. 5 is a diagram of sector S1 of the phase diagram of FIG. 4, further illustrating the relative location of a general requested delay. Sector S1 was chosen because it encompasses general requested delay RD. For the diagram of FIG. 5, sector S1 was chosen to have an angle of 45 degrees, as is preferred, although other multiples could be used, for example odd multiples of 45 degrees.

The sector is encompassed by phases P1 and P2, as determined in FIG. 4. Then the phase signal that has phase P1 is multiplied with a first preselected weight a, shown as a vector in FIG. 4. And the phase signal that has phase P2 is multiplied with a second preselected weight b, also shown as a vector in FIG. 4. Then the first and second multiplied phased signals are added together as vectors, to reconstruct the general requested delay. The phase angle α of general requested delay RD has a certain trigonometric relationship with weights a and b.

The above was performed for a general requested delay RD. In the practice of the invention, it is acceptable to simulate the general requested delay within the sector by a simulated phase. The first and second weights are selected so that simulated phases are used. When a delay is chosen of delay signal DS, it is expressed in terms of one of the simulated phases, as described below.

Figure 6:
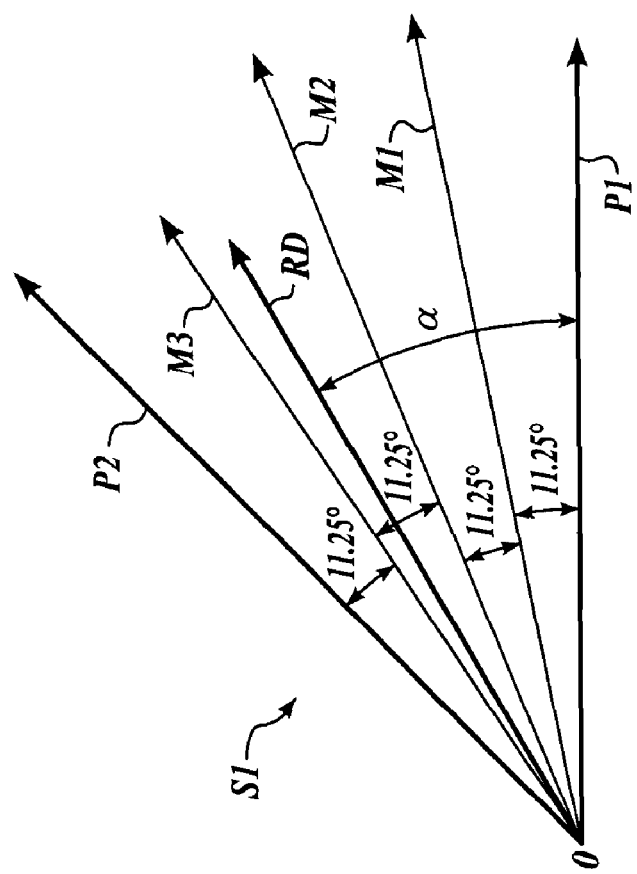
FIG. 6 illustrates a diagram of the sector of FIG. 5, showing also simulated phases for representing a general requested delay.

FIG. 6 is a diagram of the sector of FIG. 5, where general requested delay RD is shown. Further, the invention includes simulated phases M1, M2, M3, spaced within sector S1 at even intervals of 11.25 degrees. As can be seen in FIG. 6, the general requested vector RD can best be simulated by phase M3.

Figure 7:
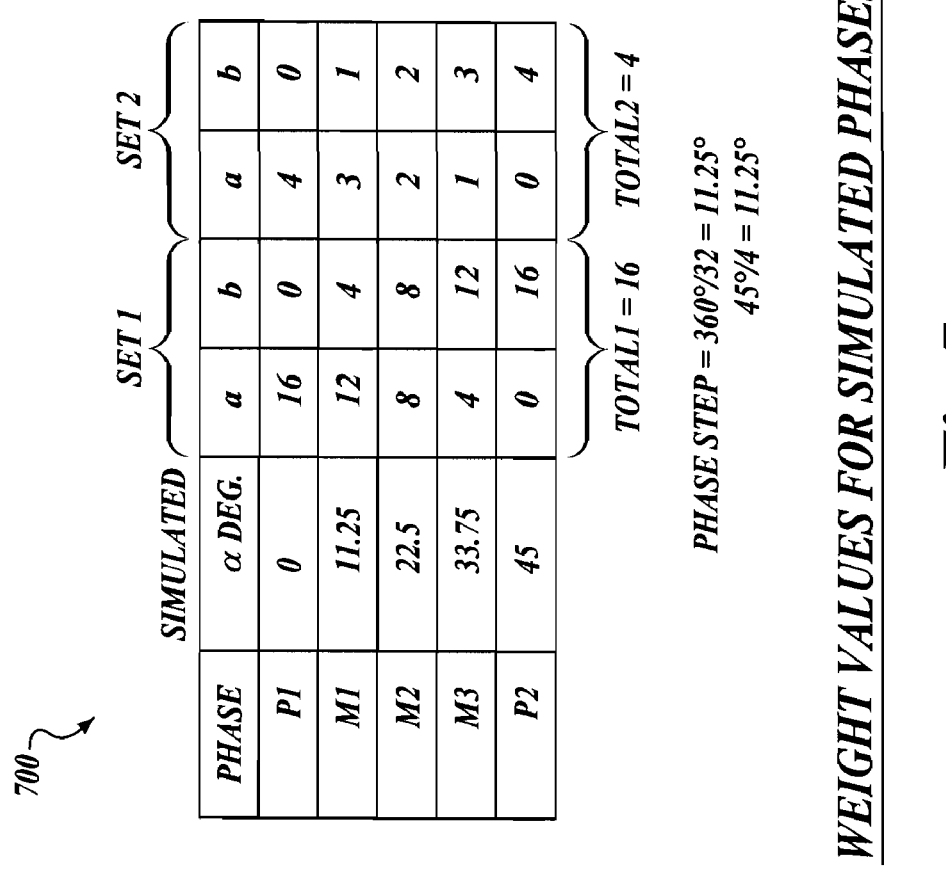
FIG. 7 illustrates a table of values of pairs of weights for embodying the simulated phases of FIG. 6.

FIG. 7 illustrates a table 700 of values of pairs of weights a and b. According to a set 1, the pairs of values of a and b have a sum total weight of 16. According to a set 2, the pairs of values of a and b have a sum total weight of 4. Set 1 is merely a multiple of set 2 by a multiplication integer. In advantageous embodiments of the invention, once weight a is known, weight b is found by subtraction from the sum total weight. It will be observed that, in set 2, weight a takes one of the values of zero, one, two, three and four.

Figure 8:
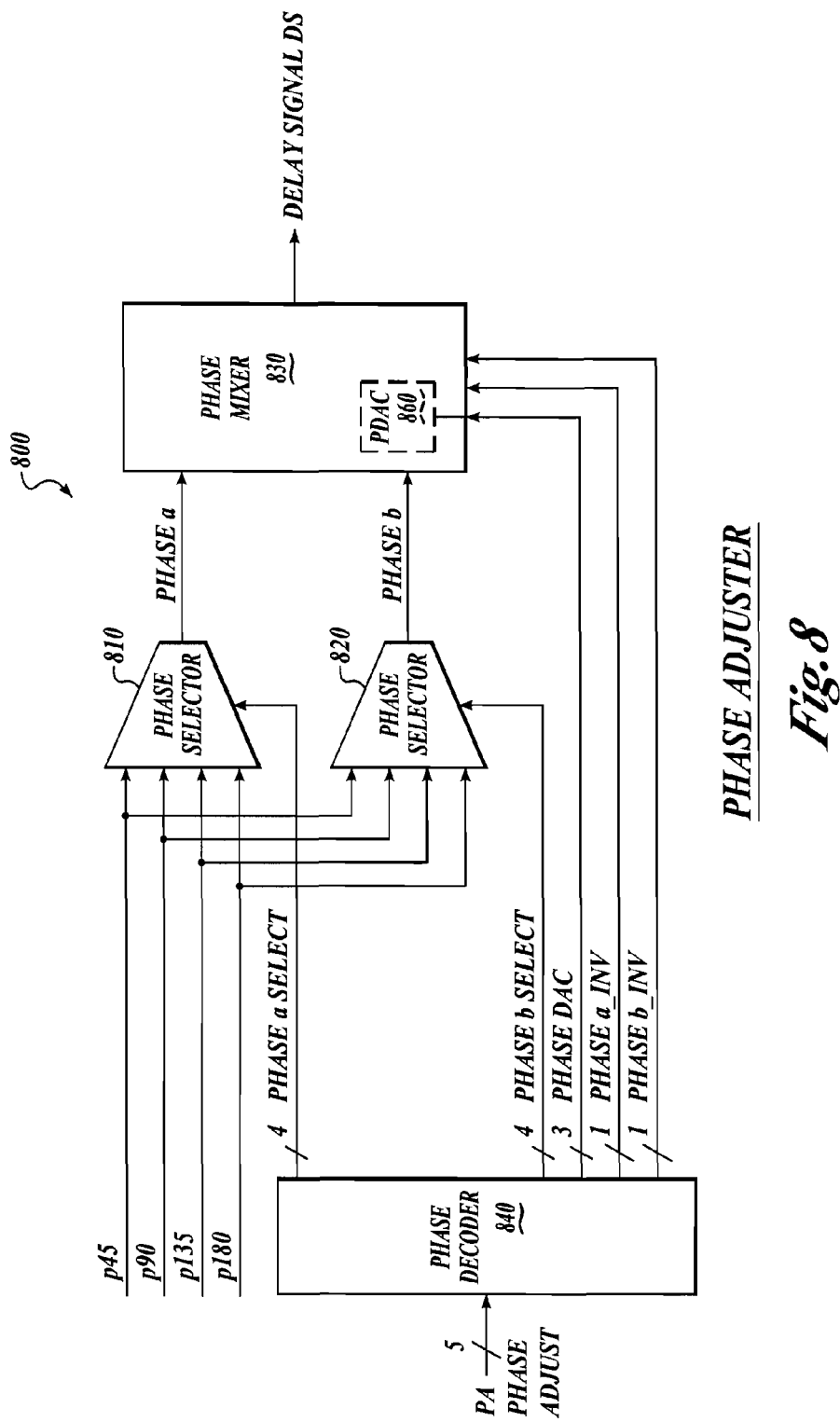
FIG. 8 illustrates a block diagram of a phase adjuster that generates a delay signal from phased signals that are apart by an odd multiple of 45 degrees.

FIG. 8 is a block diagram of a phase adjuster 800. Phase adjuster 800 generates a delay signal DS from phased signals p45, p90, p135, p180 and their negatives, which are also shown in FIG. 4. Phase adjuster 800 includes a first phase selector 810, a second phase selector 820, a phase mixer 830 and a phase decoder 840.

First phase selector 810 selects a first one of phased signals p45, p90, . . . , designated as phase a. Second phase selector 820 selects a second one of phased signals p45, p90, . . . , designated as phase b. Phase a and phase b are input into phase mixer 830. Phase mixer 830 multiplies the first selected phased signal with first weight a, and the second selected phased signal with second weight b. Phase mixer 830 then adds the first and the second multiplied phased signals to derive delay signal DS. In other words, DS=a*phase a+b*phase b.

Phase selectors 810 and 820 select phases by receiving phase selection signals. In some embodiments, some of the phase selection signals are received into the phase mixer, for example an inverted signal. In yet other embodiments, redundant signals are used to facilitate switching values.

The phase selection signals may originate from decoder 840. Decoder 840 may decode a phase adjust signal PA, and use it to generate the individual phase selection signals, as per the above. In some embodiments, phase adjust signal PA simply steps through successive values, seeking to optimize the overall result.

Phase adjuster 800 further includes a Phase Digital to Analog Converter (PDAC) 860. In some embodiments, PDAC 860 is implemented as part of phase mixer 830. PDAC 860 generates a first weight signal encoding the first weight a, and a second weight signal encoding the second weight b. The first and the second weight signals are received in phase mixer 830 to derive delay signal DS. In the embodiment of FIG. 8, decoder 840 also generates weight selection signals that are received in PDAC 860. These weight selection signals are used to generate the first and second weight signals.

Figure 9:
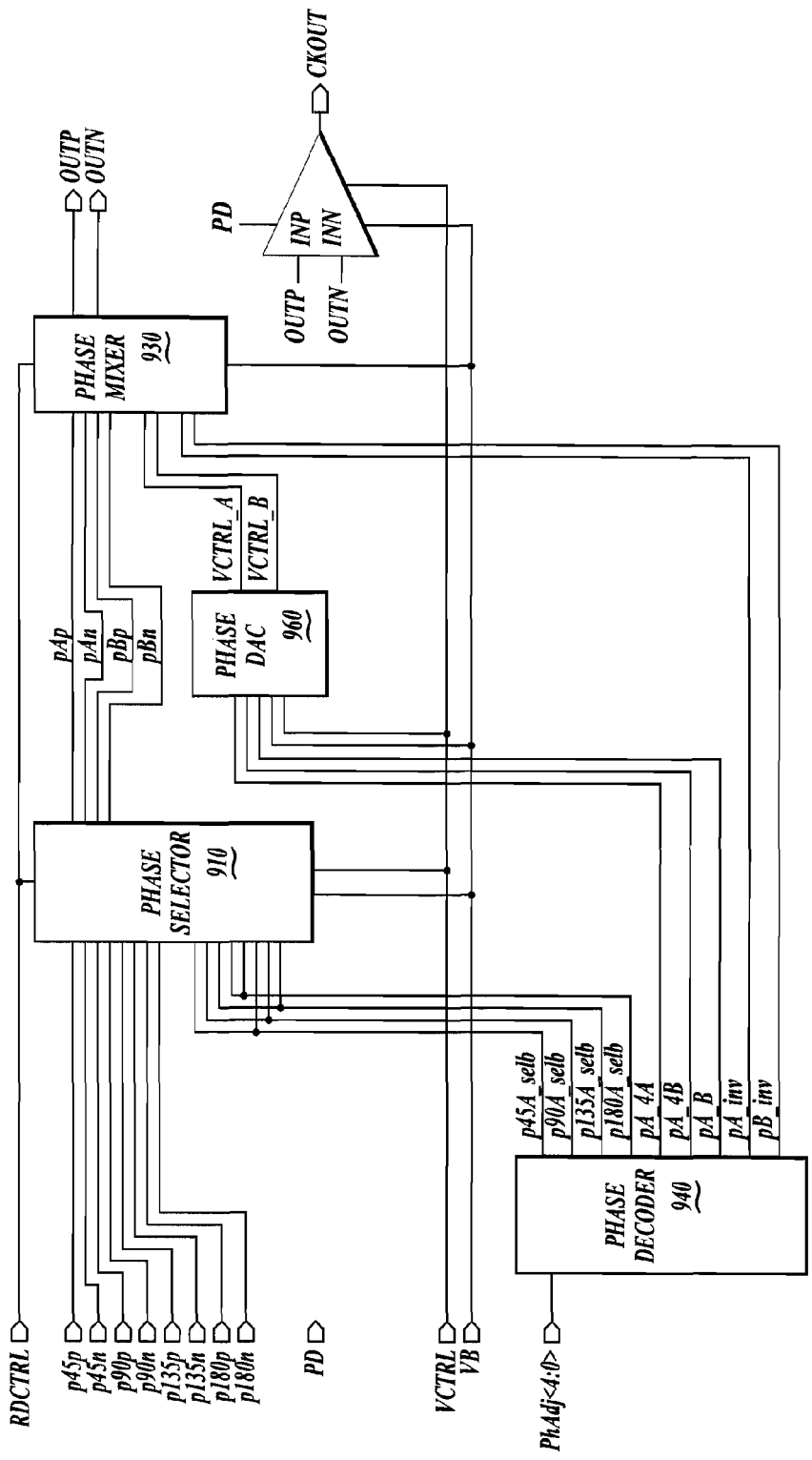
FIG. 9 illustrates a schematic diagram of an embodiment of the phase adjuster of FIG. 8 using Integrated Circuits (ICs)

FIG. 9 is a schematic diagram of a circuit 900 for embodying phase adjuster 800 using Integrated Circuits (ICs). A phase selector IC 910 implements phase selectors 810 and 820, and a phase mixer IC 930 implements phase mixer 830. A phase decoder IC 940 implements decoder 840, and a PDAC IC 960 implements PDAC 860.

Figure 10:
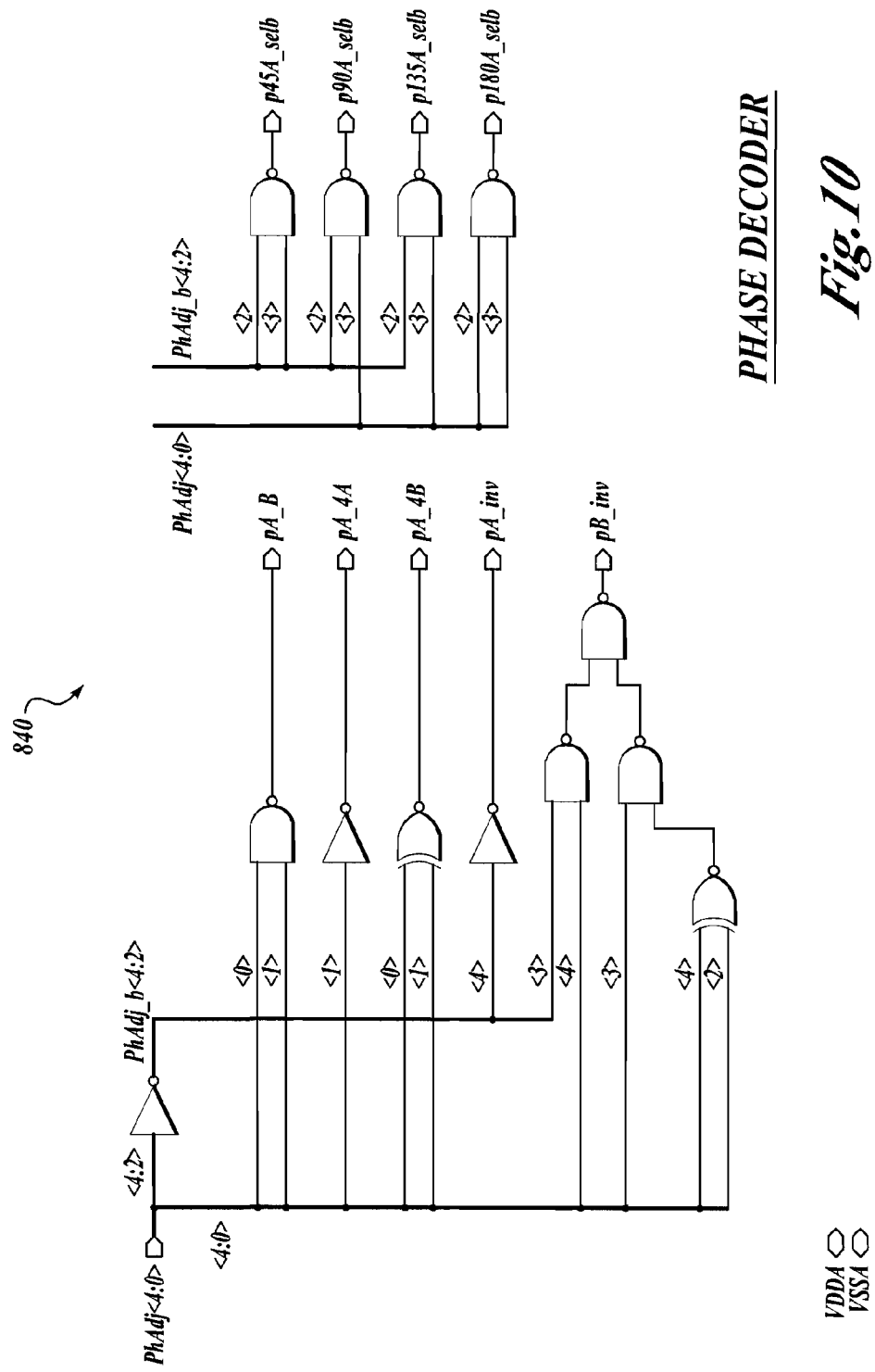
FIG. 10 illustrates a schematic diagram of a circuit for embodying a phase decoder of the phase adjuster of FIG. 8.

FIG. 10 is a schematic diagram for embodying phase decoder 840 of FIG. 8. Selection signals are generated for other components.

Figures 11, 11A, 11B:
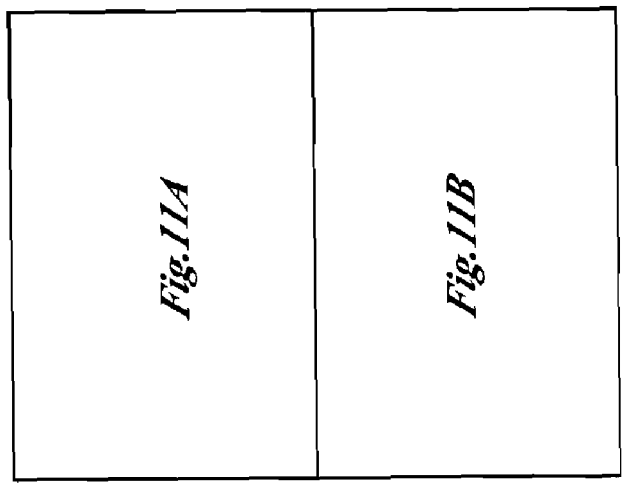
FIG. 11 illustrates a schematic diagram of a circuit for embodying two phase selectors of the phase adjuster of FIG. 8.
Figure 11A:
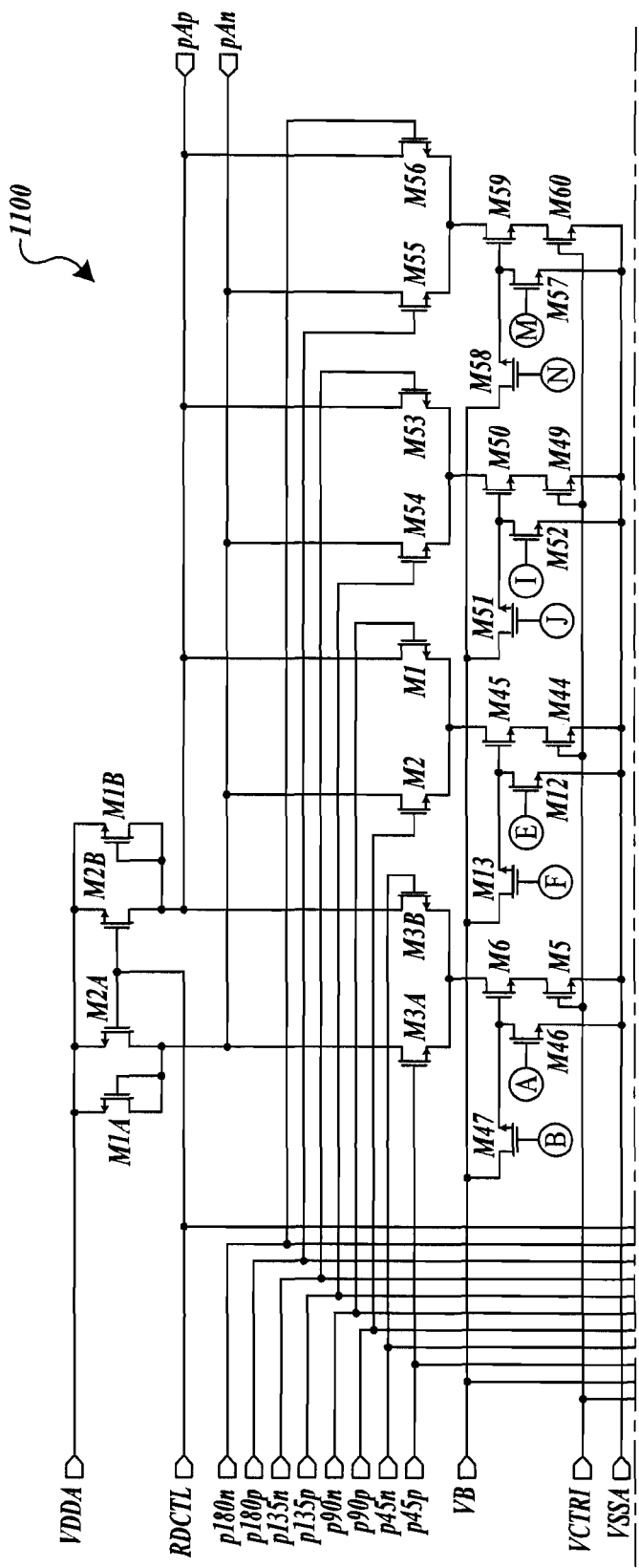

FIG. 11 is a schematic diagram of a circuit 1100 for embodying phase selectors 810, 820 of phase adjuster 800. Circuit 1100 may well be a circuit within integrated circuit 910.

Figure 12:
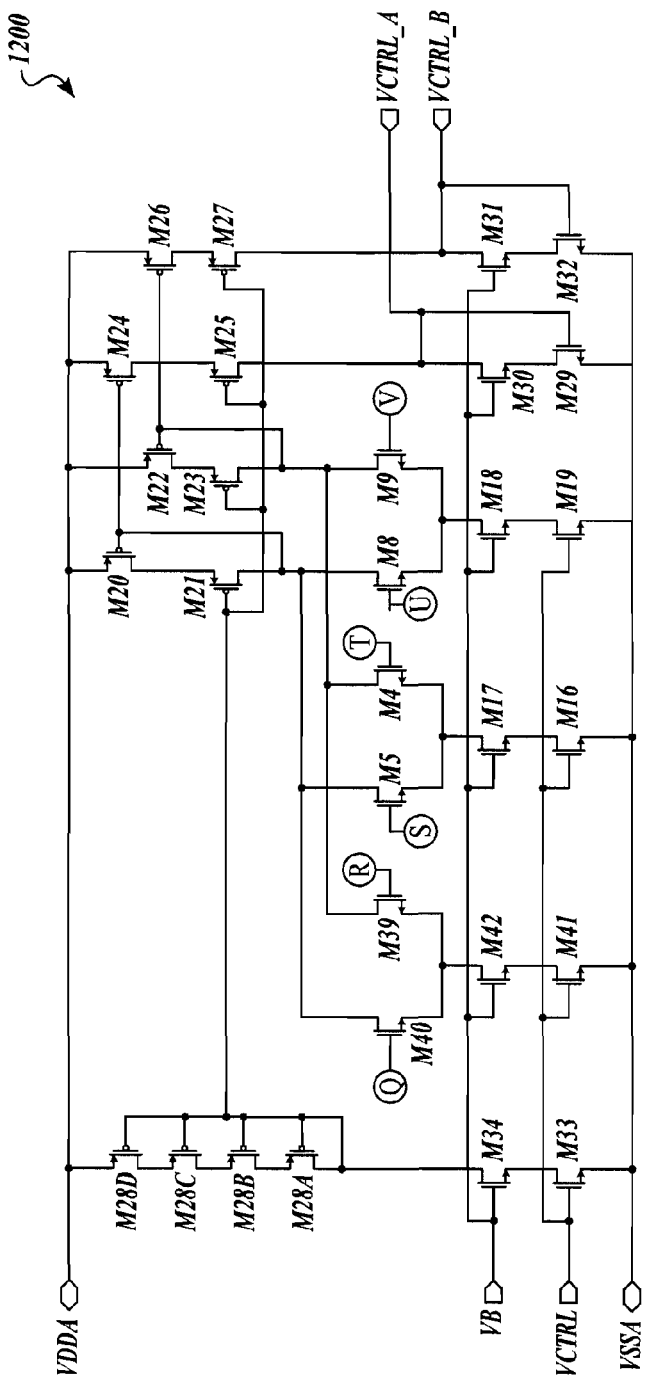
FIG. 12 illustrates a schematic diagram of a circuit for embodying a Phase Digital to Analog Converter (PDAC) of the phase adjuster of FIG. 8.

FIG. 12 is a schematic diagram of a circuit 1200 for embodying a Phase Digital to Analog Converter (PDAC) 860 of phase adjuster 800. Circuit 1200 includes a first current source M39 that draws a first current. The first current, by its value, encodes or represents the first weight a for the phase mixer. Circuit 1200 also includes a second current source M41 that draws a second current. The second current, by its value, encodes or represents the sum total weight of weights a and b. Circuit 1200 moreover includes a third current source M40 that draws a difference current between the second current (through M41) and the first current (through M39). The difference current is used to derive the second weight signal. Indeed, the current sources are implemented by transistors. Transistor M39 activates transistor M22, whose current is mirrored by transistor M26, and whose current is output by transistor M32. And transistor M40 activates transistor M20, whose current is mirrored by transistor M24, and whose current is output by transistor M29. The design is repeated for current sources M16, M19. The latter are made to appropriate scale, for implementing the values of the weights table 700. For example, transistor M41 is made the same size as transistor M16, and transistor M19 is made twice the size of M41. These components may be made to draw very small currents.

Figure 13:
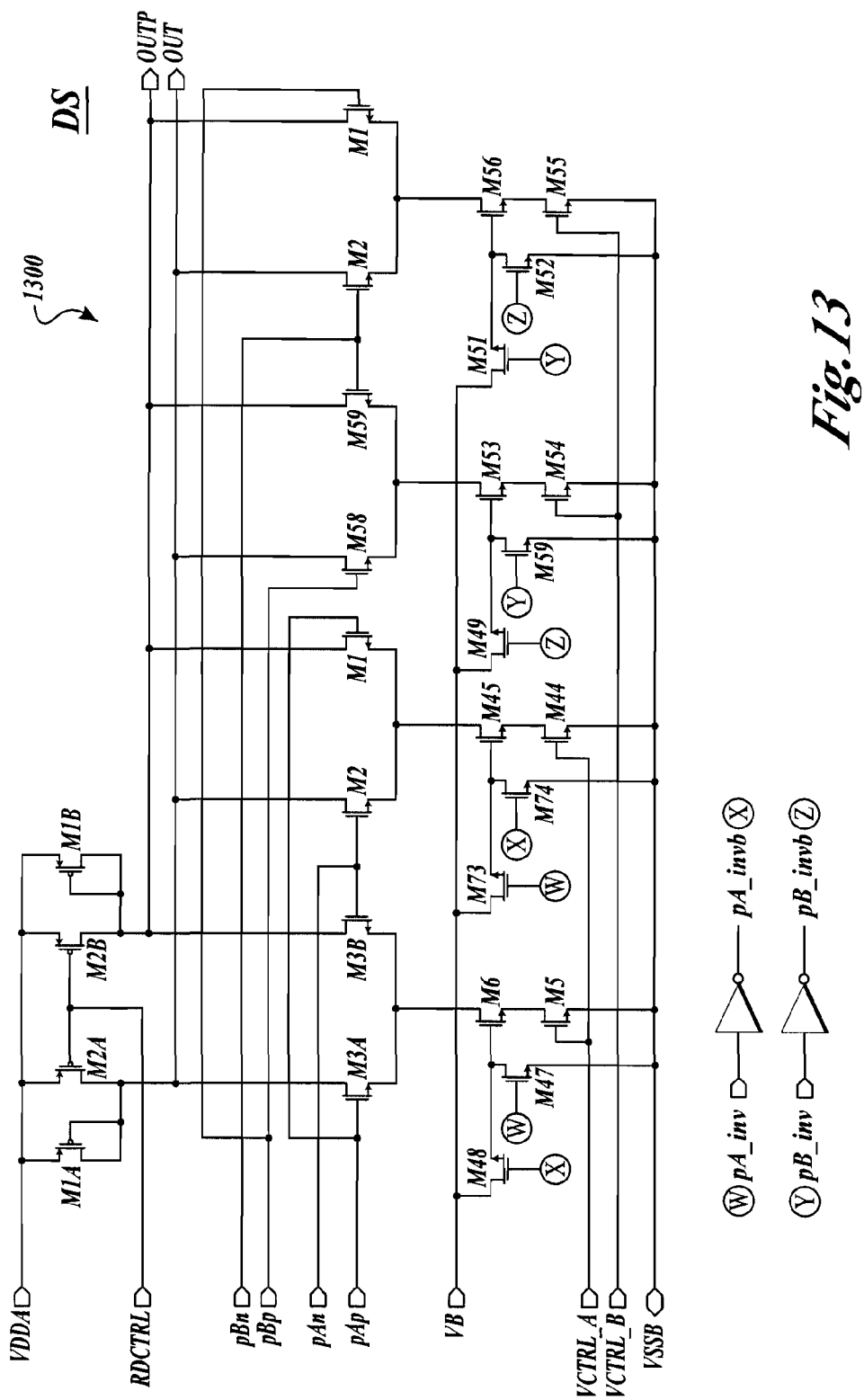
FIG. 13 illustrates a schematic diagram of a circuit for embodying a phase mixer of the phase adjuster of FIG. 8.

FIG. 13 is a schematic diagram of a circuit 1300 for embodying a phase mixer of phase adjuster 800. Circuit 1300 receives signals from the other components and outputs delay signal DS.

FIG. 14 is flowchart 1400 illustrating a method according to an embodiment of the invention. The method of flowchart 1400 may be practiced by different embodiments of the invention, including but not limited to interface 100, circuit 800, and circuit 900.

Moving from a START block, the process advances to block 1410, where a synchronizing signal is received, that is associated with a color signal. At a next block 1420, phased signals are derived. At a next block 1430, two of the phased signals are selected, which have a phase difference of an odd multiple of approximately 45 degrees. At a next block 1440, first and second weights are selected. One of them may be selected by subtracting the other one from a known sum total. At a next block 1450, the first phased signal is multiplied by the first weight, and the second phased signal is multiplied by the second weight. At a next block 1460, the multiplied signals are added together to derive a delay signal. At next block 1470, the delay signal is used to control the analog to digital conversion of the color signal. Then the process may perform other actions.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements and/or properties may be presented in this or a related document.

The invention claimed is:

1. An interface circuit for processing an input signal comprising:
   a phase locked loop (PLL) circuit adapted to generate a plurality of phased signals from a synchronizing signal that is associated with the input signal, wherein the PLL is arranged to provide each phased signal of the plurality of phased signals on at least one corresponding separate signal line of a plurality of signal lines;
   a phase adjuster including:
   a first phase selector for selecting a first one of the phased signals;
   a second phase selector for selecting a second one of the phased signals; and
   a phase mixer for multiplying the first selected phased signal with a first weight, multiplying the second selected phased signal with a second weight, and adding together the first and the second multiplied phased signals to derive an adjustable delay signal, wherein the first selected phased signal, the second selected phased signal, and at least one selected phase information signal are received into the phase mixer, wherein at least one simulated phase signal is selected as an adjustment to the synchronizing signal.

2. The circuit of claim 1, wherein
the synchronizing signal is intended to generate a pixel clock in a display, and
the phased signals replicate those of the pixel clock.

3. The circuit of claim 1, wherein
the phase adjuster further includes:
a decoder to generate phase selection signals for selecting the first and second phased signals.

4. The circuit of claim 1, wherein
the phase adjuster further includes:
a Phase Digital to Analog Converter for generating a first weight signal representing the first weight and a second weight signal representing the second weight, and
wherein the phase mixer receives the first weight signal and the second weight signal to derive the adjustable delay signal.

5. The circuit of claim 4, wherein
the phase adjuster further includes:
a decoder to generate weight selection signals for generating the first and second weight signals.

6. The circuit of claim 4, wherein the first and second weights have a substantially constant sum total weight.

7. The circuit of claim 6, wherein
the Phase Digital to Analog converter includes
a first current source drawing a first current that represents the first weight,
a second current source drawing a second current that represents the sum total weight, and
a third current source drawing a difference current between the second current and the first current, wherein the difference current is used to derive the second weight signal.

8. The circuit of claim 6, wherein
the sum total weight equals a multiplication integer times four, and
the first weight equals the multiplication integer times one of zero, one, two, three and four.

9. The circuit of claim 1, wherein the phase mixer includes:

a first switch coupled between a first node and a second node, wherein the first switch is arranged to receive the first weight signal at the first node;

a first differential pair having at least a first input, a second input, and an output, wherein the first differential pair is arranged to receive the first selected phased signal at the first input, and wherein the second input is connected to the second node;

a second switch coupled between a third node and a fourth node, wherein the second switch is arranged to receive the first weight signal at the third node;

a second differential pair having at least a first input, a second input, and an output, wherein the second differential pair is arranged to receive the first selected phased signal at the first input, and wherein the second input is connected to the fourth node;

a third switch coupled between a fifth node and a sixth node, wherein the third switch is arranged to receive the first weight signal at the fifth node; and a third differential pair having at least a first input, a second input, and an output, wherein the third differential pair is arranged to receive the second selected phased signal at the first input, and wherein the second input is connected to the sixth node.

10. The circuit of claim 9, wherein the phase mixer further includes:

a fourth switch coupled between a seventh node and an eighth node, wherein the fourth switch is arranged to receive the second weight signal at the seventh node; and a fourth differential pair having at least a first input, a second input, and an output, wherein the fourth differential pair is arranged to receive the second selected phased signal at the first input, and wherein the second input is connected to the eighth node, wherein the outputs of the differential pairs are connected to an output bus.

11. The circuit in claim 9, wherein the at least one selected phase information signal activates one of the first differential pair or the second differential pair, wherein if the first differential pair is activated, the first switch is closed and the second switch is open, and wherein if the second differential pair is activated, the first switch is open and the second switch is closed.

12. The circuit of claim 1, further comprising:

an analog to digital converter adapted to improve processing of the input signal by choosing an adjustment to the delay signal.

13. An interface circuit for processing an analog color signal, comprising:

a phase locked loop (PLL) circuit adapted to generate a plurality of phased signals from a synchronizing signal that is associated with the analog color signal;

a phase adjuster adapted to generate an adjustable delay signal from two of the plurality of phased signals that are apart from each other by an odd multiple of approximately 45 degrees, wherein the phase adjuster includes:

a first phase selector for selecting a first one of the phased signals;

a second phase selector for selecting a second one of the phased signals; and a phase mixer for multiplying the first selected phased signal with a first weight, multiplying the second selected phased signal with a second weight, and adding together the first and the second multiplied phased signals to derive the adjustable delay signal; wherein the first selected phased signal, the second selected phased signal, and at least one selected phase information signal are received into the phase mixer; and a decoder to generate phase selection signals for selecting the first and second phased signals; and an analog to digital converter adapted to improve processing of the analog color signal by choosing an adjustment to the delay signal, wherein at least one simulated phase signal is provided.

14. A device comprising:

means for deriving a plurality of phased signals from a synchronizing signal associated with an input signal, wherein the PLL is arranged to provide each phased signal of the plurality of phased signals on at least one corresponding separate signal line of a plurality of signal lines;

means for deriving an adjustable delay signal including:
means for selecting a first one of the phased signals;
means for selecting a second one of the phased signals; and mixing means including:
means for multiplying the first selected phased signal with a first weight;
means for multiplying the second selected phased signal with a second weight; and
means for adding together the first and the second multiplied phased signals to derive the adjustable delay signal, wherein the first selected phased signal, the second selected phased signal, and at least one selected phase information signal are received into the mixing means means for choosing an adjustment to the adjustable delay signal, wherein at least one simulated phase signal is provided.

15. The device of claim 14, wherein the means for deriving the phased signals includes phase locked loop (PLL) circuit.

16. A method for generating a delay signal for processing an input signal, comprising:

deriving a plurality of phased signals from a synchronizing signal associated with the input signal, wherein the PLL is arranged to provide each phased signal of the plurality of phased signals on at least one corresponding separate signal line of a plurality of signal lines;

deriving the delay signal from two of the plurality of phased signals including:

selecting two phased signals from the plurality of phased signals;

providing at least one selected phase information signal;

multiplying a first one of the selected phased signals with a first weight, wherein the first weight is based, at least in part, on the at least one selected phase information signal;

multiplying a second one of the selected phased signals with a second weight, wherein the second weight is based, at least in part, on the at least one selected phase information signal; and adding together the first and the second multiplied phased signals; and choosing an adjustment to the delay signal to improve conversion of the input signal into digital form, wherein at least one simulated phase signal is provided.

17. The method of claim 16, wherein the phased signals are derived in a phase locked loop (PLL) circuit.

18. The method of claim 17, wherein
the synchronizing signal is intended to generate a pixel clock in a display, and
the phased signals replicate those of the pixel clock.

19. The method of claim 16, wherein
deriving is performed by:
determining the location of a general requested delay in a phase diagram,
wherein the two phased signals are selected such that they define a sector between on the phase diagram that encompasses the general required delay.

20. The method of claim 16, further comprising:
selecting first and second weights so as to simulate the general requested delay within the sector.

21. The method of claim 20, further comprising:
subtracting the first weight from a preset sum total weight to derive the second weight.

22. The method of claim 21, wherein
the sum total weight equals a multiplication integer times four, and
the first weight equals the multiplication integer times one of zero, one, two, three and four.

23. An interface circuit for processing an input signal, comprising:
a phase locked loop (PLL) circuit adapted to generate a plurality of phased signals from a synchronizing signal that is associated with the input signal;
a phase adjuster adapted to generate an adjustable delay signal from two of the plurality of phased signals, wherein the phase adjuster includes:
a phase mixer, including:
at least three differential pairs, wherein a first one of the differential pairs is arranged to multiply a first selected phased signal with a first weight and a second one of the differential pairs is arranged to multiply a second selected phased signal with a second weight, and wherein the phase mixer is configured to activate two differential pairs from the at least three differential pairs to derive the adjustable delay signal, wherein at least one simulated phase signal is selected as an adjustment to the synchronizing signal.

24. The circuit of claim 23, wherein the more than two differential pairs includes at least four differential pairs.

25. The circuit of claim 24, wherein the phase mixer is arranged such that the selection of active differential pairs sets the polarity of the adjustable delay signal.

26. An interface circuit for processing an input signal comprising:
a phase locked loop (PLL) circuit adapted to generate a plurality of phased signals from a synchronizing signal that is associated with the input signal, wherein the PLL is arranged to provide each phased signal of the plurality of phased signals on at least one corresponding separate signal line of a plurality of signal lines;
a phase adjuster including:
a Phase Digital to Analog Converter, including:
a first current source circuit that is arranged to receive a first control input, wherein while the first control input is at a first logic level, the first current source circuit provides a current of a first magnitude to a first weight signal, and wherein while the first control input is at a second logic level, the first current source provides a current of the first magnitude to a second weight signal;
a second current source circuit that is arranged to receive a second control input, wherein while the second control input is at a first logic level, the second current source circuit provides a current of a second magnitude to the first weight signal, and wherein while the second control input is at a second logic level, the second current source provides a current of the second magnitude to the second weight signal; and
a third current source circuit that is arranged to receive a third control input, wherein while the third control input is at a first logic level, the third current source circuit provides a current of a third magnitude to the first weight signal, and wherein while the third control input is at a second logic level, the third current source provides a current of the third magnitude to the second weight signal, wherein the Phase Digital to Analog Converter is arranged to provide a first weight, based at least in part on the first weight signal and to provide a second weight, based at least in part on the second weight signal; and
a phase mixer for multiplying a first selected phased signal with the first weight, multiplying a second selected phased signal with the second weight, and adding together the first and the second multiplied phased signals to derive an adjustable delay signal.

27. The circuit of claim 26, wherein the first magnitude is substantially equal to the second magnitude, and wherein the third magnitude is substantial equal to the sum of the first magnitude and the second magnitude.

28. The circuit of claim 26, wherein the first current source circuit includes:
a first transistor that is arranged to provide a current of the first magnitude; and
a second transistor that is arranged to couple the first transistor to the first weight signal while the first control signal is asserted; and
a third transistor that is arranged to couple the first transistor to the second weight signal while the first control signal is deasserted,
wherein the second current source circuit includes:
a first transistor that is arranged to provide a current of the second magnitude; and
a second transistor that is arranged to couple the first transistor to the first weight signal while the second control signal is asserted; and
a third transistor that is arranged to couple the first transistor to the second weight signal while the second control signal is deasserted,
and wherein the third current source circuit includes:
a first transistor that is arranged to provide a current of the third magnitude; and
a second transistor that is arranged to couple the first transistor to the first weight signal while the third control signal is asserted; and
a third transistor that is arranged to couple the first transistor to the second weight signal while the third control signal is deasserted.

29. The circuit of claim 26, wherein the current of the first magnitude, the current of the second magnitude, and the current of the third magnitude are provided by sinking the current of the first magnitude, the current of the second magnitude, and the current of the third magnitude, respectively, and wherein each of the first current source circuit, the second current source circuit, and the third current source circuit is arranged to selectively sink current such that a value of the first weight or a value of the second weight is reduced.

* * * * *

UNITED STATES PATENT AND TRADEMARK OFFICE
CERTIFICATE OF CORRECTION

| | | |
|---|---|---|
| PATENT NO. | : 7,271,788 B2 | Page 1 of 1 |
| APPLICATION NO. | : 10/718975 | |
| DATED | : September 18, 2007 | |
| INVENTOR(S) | : Vu | |

It is certified that error appears in the above-identified patent and that said Letters Patent is hereby corrected as shown below:

In column 8, line 32, in Claim 14, before "for" delete "means".

Signed and Sealed this

Fourth Day of December, 2007

JON W. DUDAS
*Director of the United States Patent and Trademark Office*